US009529014B1

(12) United States Patent
Minneman

(10) Patent No.: US 9,529,014 B1
(45) Date of Patent: Dec. 27, 2016

(54) SYSTEM AND METHOD FOR ACQUIRING ELECTRICAL MEASUREMENTS OF AN ELECTRONIC DEVICE

(71) Applicant: INSIGHT PHOTONIC SOLUTIONS, INC., Lafayette, CO (US)

(72) Inventor: Michael Minneman, Lafayette, CO (US)

(73) Assignee: Insight Photonic Solutions, Inc., Lafayette, CO (US)

(*) Notice: Subject to any disclaimer, the term of this patent is extended or adjusted under 35 U.S.C. 154(b) by 287 days.

(21) Appl. No.: 14/210,767

(22) Filed: Mar. 14, 2014

Related U.S. Application Data

(60) Provisional application No. 61/786,934, filed on Mar. 15, 2013.

(51) Int. Cl.
*G01R 1/067* (2006.01)

(52) U.S. Cl.
CPC ....................................... *G01R 1/067* (2013.01)

(58) Field of Classification Search
None
See application file for complete search history.

(56) References Cited

U.S. PATENT DOCUMENTS

| | | | | | |
|---|---|---|---|---|---|
| 3,992,073 | A * | 11/1976 | Buchoff | ................ | H01R 11/18 324/72.5 |
| 4,245,189 | A * | 1/1981 | Wahl | ................ | G01R 1/06788 324/716 |
| 4,927,368 | A * | 5/1990 | Shino | ................ | H01R 12/52 439/591 |
| 5,606,263 | A * | 2/1997 | Yoshizawa | ........ | G01R 1/07307 324/754.11 |
| 5,903,161 | A * | 5/1999 | Amemiya | ............ | B82Y 35/00 324/755.11 |
| 5,914,612 | A * | 6/1999 | Koken | ............... | G01R 1/06788 324/72.5 |
| 6,529,024 | B2 * | 3/2003 | Noda | ................... | G01R 1/0675 324/72.5 |
| 7,202,678 | B2 * | 4/2007 | Campbell | ......... | G01R 1/06711 324/755.11 |

* cited by examiner

*Primary Examiner* — Paresh Patel
(74) *Attorney, Agent, or Firm* — Renner, Otto, Boisselle and Sklar LLP

(57) ABSTRACT

Provided is a method and an apparatus for acquiring electrical measurements of an electronic device. The method and the apparatus comprise securing an elastomeric connector at least partially inside a cavity within a truncated front end of an electrical probe, wherein the electrical probe is physically and electrically coupled to an electric cable; physically and electrically coupling the electric cable to a data processor; electrically connecting the elastomeric connector end to said electronic device; and outputting electrical measurement data from the elastomeric connector end through the electric cable to said data processor. The advantages are that the connection can be single wire per probe or two wires per probe, with only a single physical connection required, and the lack of probe damage to the feature being probed.

22 Claims, 6 Drawing Sheets

SYSTEM AND METHOD FOR ACQUIRING ELECTRICAL MEASUREMENTS OF AN ELECTRONIC DEVICE

RELATED APPLICATIONS

This application is a Non-Provisional of the U.S. Application No. 61/786,934 filed Mar. 15, 2013, which is hereby incorporated herein by reference in its entirety.

TECHNICAL FIELD

The present invention relates generally to an apparatus and a method for acquiring electrical measurements of an electronic device.

BACKGROUND

For years, it is common to use a rubber strip, often called a Zebra strip, to make dozens of electrical connections between an LCD and a circuit card. There are two types of Zebra strips: rectangular conductor-style Zebra strip and circular conductor-style Zebra strip. The Zebra strip creates electrical connections between the conductors on the back of the LCD and the conductors on the circuit card.

When probing a small object on a circuit board or other electrical substrate (e.g. a Zebra strip), a testing device needs to make good electrical connection without damaging the object. In addition, for certain measurements, a four-wire measurement technique can be utilized to improve the quality of the measurement, but making four connections (as opposed to the more typical two connections) on a small object can be even more difficult.

In the prior art, a typical technology for probing such small objects is the use of metal pins. Metal pins generally have points that make contact with the circuit card. However, the metal pins can often damage the object being probed.

SUMMARY

One aspect of the disclosure relates to a method for acquiring electrical measurements of an electronic device, the method comprising: securing an elastomeric connector at least partially inside a cavity within a truncated front end of an electrical probe, wherein the electrical probe is physically and electrically coupled to an electric cable; physically and electrically coupling the electric cable to a data processor; electrically connecting the elastomeric connector end to said electronic device; and outputting electrical measurement data from the elastomeric connector end through the electric cable to said data processor.

Alternatively or additionally, the elastomeric connector comprises at least one conductive layer defining two opposing walls and at least two nonconductive layers, each nonconductive layer defining two opposing walls, an inner wall of one of the nonconductive layers being in physical contact with one wall of the at least one conductive layer and an inner wall of another nonconductive layer being in physical contact with the other wall of the at least one conductive layer.

Alternatively or additionally, the at least one conductive layer is comprised of carbon filled silicone rubber material.

Alternatively or additionally, each nonconductive layer is comprised of silicone rubber material.

Alternatively or additionally, the at least one conductive layer and each nonconductive layer have a height dimension that is equal to at least 1.5 times the width dimension.

Alternatively or additionally, the elastomeric connector comprises at least one nonconductive layer defining two opposing faces, the at least one nonconductive layer comprising at least one conductive pathway extending between the faces.

Alternatively or additionally, the at least one nonconductive layer is comprised of silicone rubber material.

Alternatively or additionally, the at least one conductive pathway is comprised of gold-plated phosphor bronze material.

Alternatively or additionally, the elastomeric connector comprises at least one protective layer defining two opposing walls, an inner wall of the includes least one protective layer being in physical contact with an outer wall of one of the nonconductive layers and an outer wall of the at least one protective layer being in physical contact with the cavity.

Alternatively or additionally, the at least one protective layer is selected from a group consisting of an insulator and a supporter.

Alternatively or additionally, the protective layer is comprised of silicone rubber material having a solid composition.

Alternatively or additionally, the protective layer is comprised of silicone rubber material having a porous composition.

Alternatively or additionally, the data processor is an electronic testing equipment.

Alternatively or additionally, the electronic device comprises an element adapted to enable electrical connection.

Alternatively or additionally, the element is a pin.

Alternatively or additionally, the element is a wire.

Alternatively or additionally, the truncated front end has at least one tapered side wall.

Another aspect of the disclosure relates to an electrical probe comprising: an elongated support adapted to be physically and electrically coupled to an electric cable, wherein the electric cable is physically and electrically coupled to a data processor; a truncated front end physically and electrically coupled to the support; a cavity within the front end; and an elastomeric connector adapted to at least partially fit inside the cavity, the elastomeric connector enabling electrical connection to an electronic device.

Alternatively or additionally, the elastomeric connector includes at least one conductive layer defining two opposing walls and at least two nonconductive layers, each nonconductive layer defining two opposing walls, an inner wall of one of the nonconductive layers being in physical contact with one wall of the at least one conductive layer and an inner wall of another nonconductive layer being in physical contact with the other wall of the at least one conductive layer.

Alternatively or additionally, the at least one conductive layer is comprised of carbon-filled silicone rubber material.

Alternatively or additionally, each nonconductive layer is comprised of silicone rubber material.

Alternatively or additionally, the at least one conductive layer and each nonconductive layer have a height dimension that is equal to at least 1.5 times the width dimension.

Alternatively or additionally, the elastomeric connector comprises at least one nonconductive layer defining two opposing faces and at least one conductive pathway extending between the faces.

Alternatively or additionally, the at least one nonconductive layer is comprised of silicone rubber material.

Alternatively or additionally, the at least one conductive pathway is comprised of gold-plated phosphor bronze material.

Alternatively or additionally, the elastomeric connector comprises at least one protective layer defining two opposing walls, an inner wall of the at least one protective layer being in physical contact with an outer wall of one of the nonconductive layers and an outer wall of the at least one protective layer being in physical contact with the cavity.

Alternatively or additionally, the at least one protective layer is selected from a group consisting of an insulator and a supporter.

Alternatively or additionally, the protective layer is comprised of silicone rubber material having a solid composition.

Alternatively or additionally, the protective layer is comprised of silicone rubber material having a porous composition.

Alternatively or additionally, the data processor is an electronic testing equipment.

Alternatively or additionally, the electronic device comprises an element adapted to enable electrical connection.

Alternatively or additionally, the element is a pin.

Alternatively or additionally, the element is a wire.

Alternatively or additionally, the front end has at least one tapered side wall.

In according with the above features, the connection can be single wire per probe or two wires per probe with only a single physical connection. Such features provide the advantage of preventing damage to the object being probed.

A number of features are described herein with respect to embodiments of the invention; it will be appreciated that features described with respect to a given embodiment also may be employed in connection with other embodiments.

The invention includes the features described herein, including the description, the annexed drawings, and, if appended, the claims, which set forth in detail certain illustrative embodiments. These embodiments are indicative, however, of but a few of the various ways in which the principles of the invention may be employed.

DESCRIPTION

Figure 1:
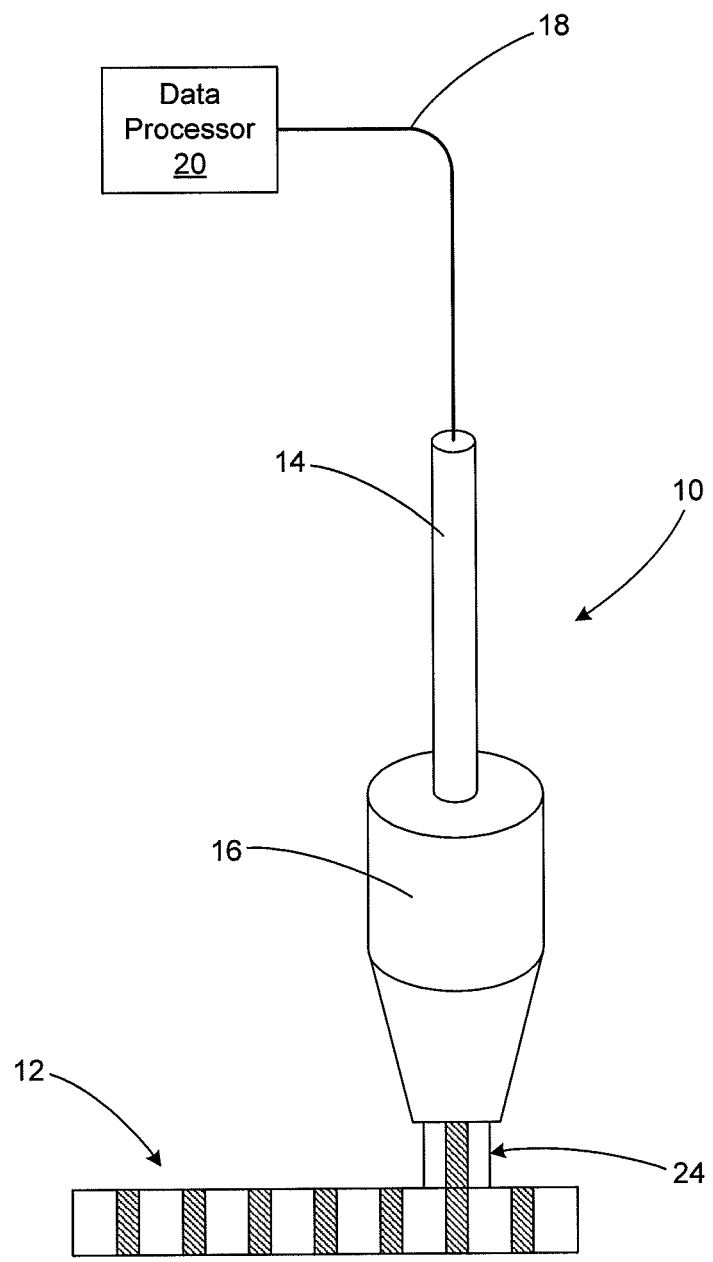
FIG. 1 is an exemplary electrical probe according with the disclosure.

Referring now to the drawings in detail, and initially to FIG. 1, an exemplary electrical probe 10 is illustrated. The electrical probe 10 is configured to acquire electrical measurements of an electronic device 12, such as a Zebra strip. The electrical probe 10 includes an elongated support 14, a truncated front end 16 and an elastomeric connector 24. In the illustrated embodiment the support 14 is tubular in shape, although it will be appreciated that the support can be any other suitable shape, such as a rectangular shape or a triangular shape.

Figure 2:
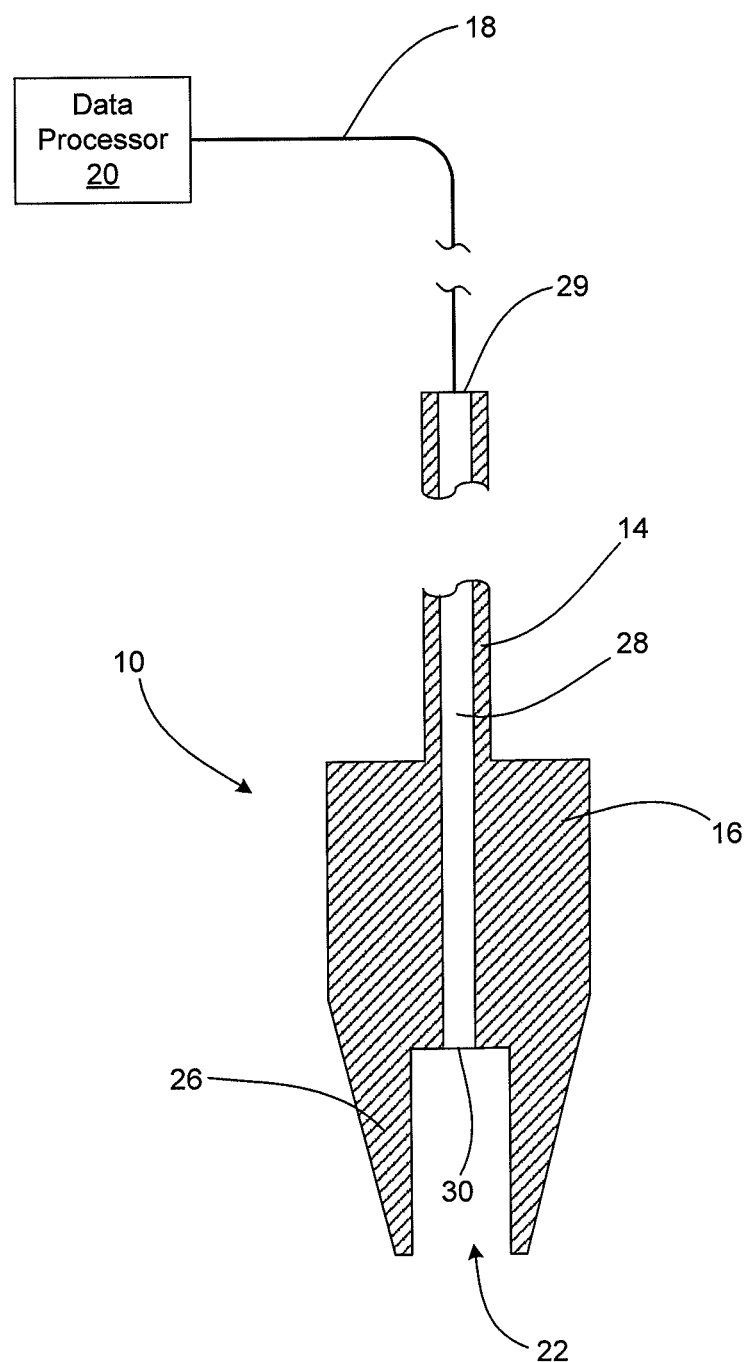
FIG. 2 is a cross-sectional view of the probe without an elastomeric connector shown in FIG. 1.

Referring to FIG. 2, the front end 16 is physically coupled to the support 14. At the bottom portion of the front end 16 is a cavity 22 for receiving the elastomeric connector 24. In the illustrated embodiment, the front end 16 is provided with tapered side walls 26 for receiving the upper portion of the elastomeric connector 24 to secure the elastomeric connector 24 to the front end 16. It will be appreciated, however, that the elastomeric connector may be secured to the front end by other suitable means such as by a rubber stopper.

The probe 10 also comprises a conductive channel 28 that is located within both the support 14 and the front end 16. The top end 29 of the conductive channel 28 is adapted to be physically and electrically coupled to an electric cable 18. The electric cable 18 is physically and electrically coupled to a data processor 20, for example and electronic testing equipment. The elastomeric connector 24 is physically and electrically coupled to the bottom end 30 of the conductive channel 28. The elastomeric connector 24 enables electrical connection to the electronic device 12. The electronic device 12 may be adapted to enable electrical connection by the elements of the electronic device 12, such as pins or wires. At this point, an electrical connection may be coupled from the electronic device 12 to the data processor 20. The conductive channel 28 in the illustrated embodiment is made of a conductive material that has smaller resistivity than both the support 14 and the front end 16. A person having ordinary skill in the art will appreciate that the conductive channel can be formed by a tunnel and a wire within the tunnel.

Figure 3:
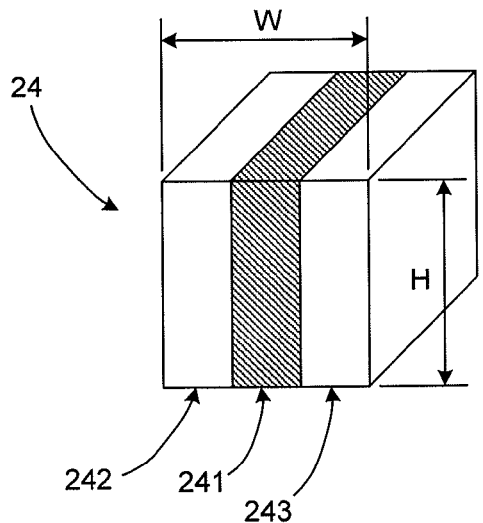
FIG. 3 is an elastomeric connector according with the disclosure.
Figure 4:
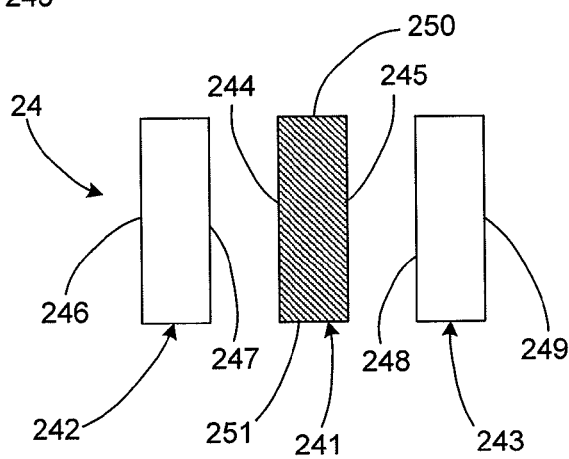
FIG. 4 is a cross-sectional view of the elastomeric connector shown in FIG. 3.

Turning to FIGS. 3 and 4, shown is an exemplary elastomeric connector 24. The electrical probe 10 having the elastomeric connector 24 may be configured to be a two-wire measure rectangular conductor-style Zebra strip with another electrical probe 10 having the same elastomeric connector 24. The elastomeric connector 24 has a conductive layer 241 and two nonconductive layers 242 and 243. The conductive layer 241 defines two opposing walls 244 and 245. The nonconductive layer 242 defines an outer wall 246 and an inner wall 247. The nonconductive layer 243 defines an inner wall 248 and an outer wall 249. The inner walls 247 and 248 of the nonconductive layers 242 and 243 are respectively in physical contact with the walls 244 and 245 of the conductive layer 241. The outer walls 246 and 249 of the nonconductive layers 242 and 243 are in physical contact with the cavity 22. The conductive layer 241 also defines a top surface 250 and a bottom surface 251. The top surface 250 is configured to electrically couple to the bottom end 30 of the conductive channel 28. The bottom surface 251 is configured to enable electrical connection to the electronic device 12. Therefore, an electrical connection may be coupled from the electronic device 12 to the data processor 20.

In addition, in order to secure the elastomeric connector 24 into the front end 16, the height H of the elastomeric connector 24 is preferably equal to at least 1.5 times the width W of the elastomeric connector 24. A person having ordinary skill in the art should understand the requirement of the radio of height to width may apply to the following embodiment.

Figure 5:
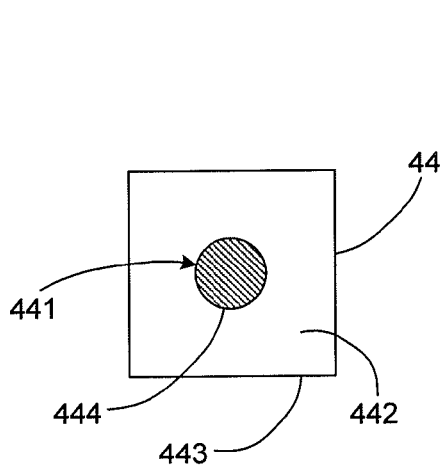
FIG. 5 is a bottom view of another elastomeric connector according with the disclosure.
Figure 6:
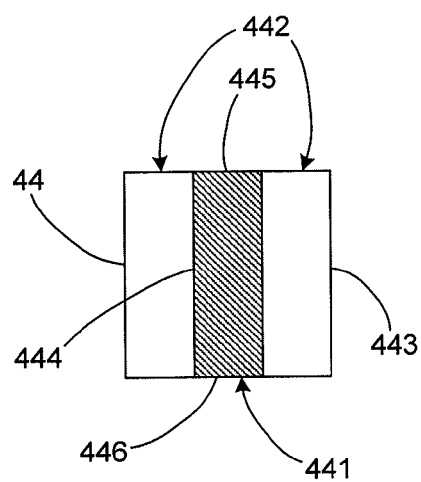
FIG. 6 is a cross-sectional view of the elastomeric connector shown in FIG. 5.

Turning now to FIGS. 5 and 6, another embodiment of the elastomeric connector is indicated by reference numeral 44. The electrical probe 10 having the elastomeric connector 44 is configured to a two-wire measure circular conductor-style Zebra strip with another electrical probe 10 having the same elastomeric connector 44. The elastomeric connector 44 comprises a nonconductive layer 442 defining an outer face 443 and an inner face 444. The elastomeric connector 44 also comprises a conductive pathway 441 extending among the face 443. The face 444 is in physical contact with the cavity 22. The conductive pathway 441 defines a top surface 445 and a bottom surface 446. The top surface 445 is configured to electrically couple to the bottom end 30 of the conductive channel 28. The bottom surface 446 is configured to enable electrical connection to the electronic device 12. Therefore, an electrical connection may be coupled from the electronic device 12 to the data processor 20.

Figure 7:
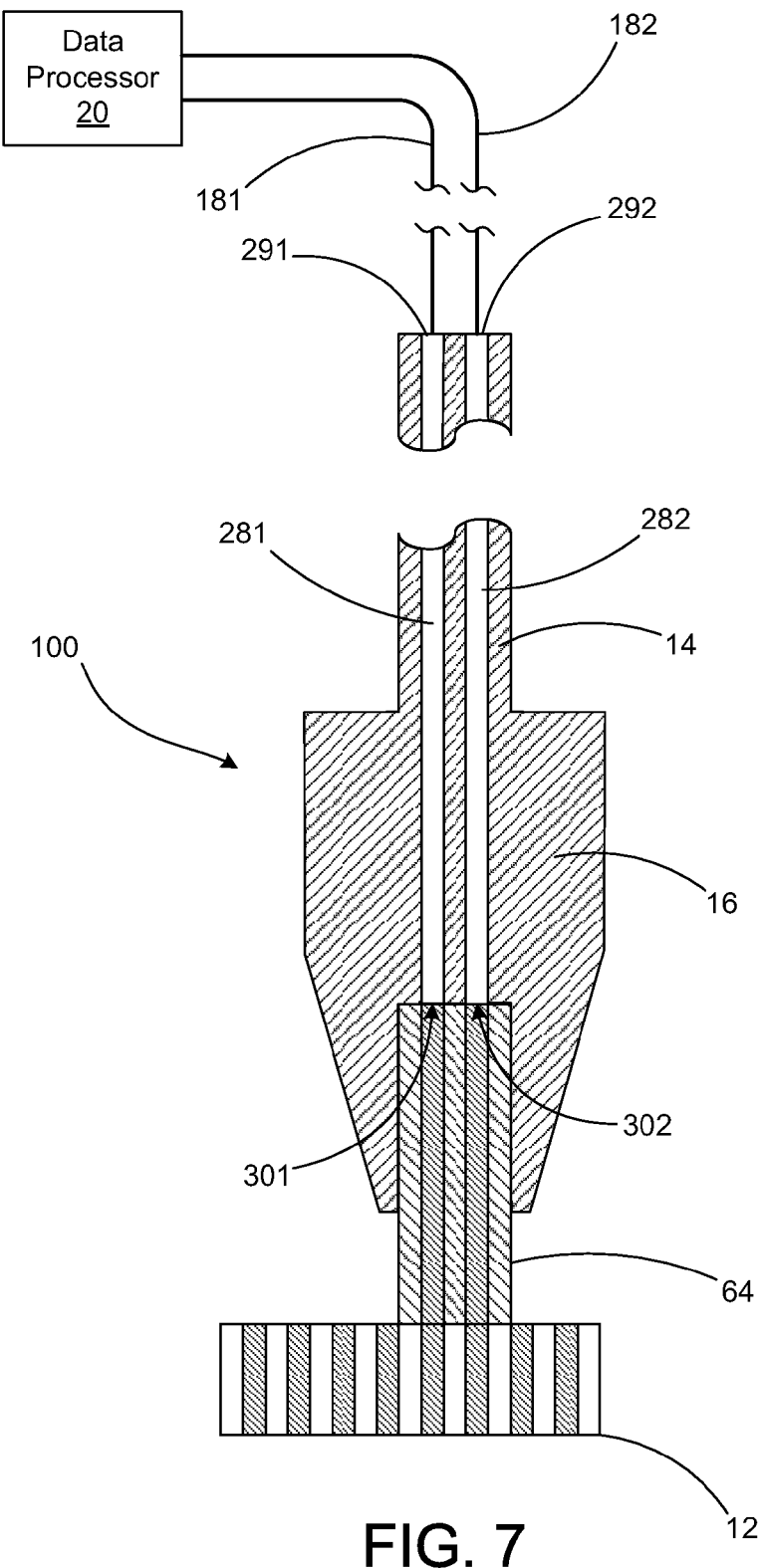
FIG. 7 is a cross-sectional view of another probe according with the disclosure.

Turning now to FIG. 7, another embodiment of electrical probe is shown indicated by reference 100. The electrical probe 100 is substantially the same as the above referenced electrical probe 10, and consequently the same reference numerals are used to denote structures corresponding to similar structures in the electrical probe 100. In addition, the foregoing description of the electrical probe is equally applicable to the electrical probe 100 except as noted below.

FIG. 7 shows a cross-sectional view of the electrical probe 100. As shown in FIG. 7, the probe 100 comprises two conductive channels 281 and 282 that are located within both the support 14 and the front end 16. The top ends 291 and 292 of the conductive channel 28 are adapted to be physically and electrically coupled to two electric cables 181 and 182, respectfully. The electric cables 181 and 182 are physically and electrically coupled to a data processor 20, for example electronic testing equipment. The elastomeric connector 64 is physically and electrically coupled to the bottom end 301 of the conductive channel 281 and the bottom end 302 of the conductive channel 282. The elastomeric connector 24 enables electrical connection to the electronic device 12. The electronic device 12 may be adapted to enable electrical connection by the elements of the electronic device 12, such as pins or wires. At this point, two separated electrical connections may be coupled from the electronic device 12 to the data processor 20.

Figure 8:
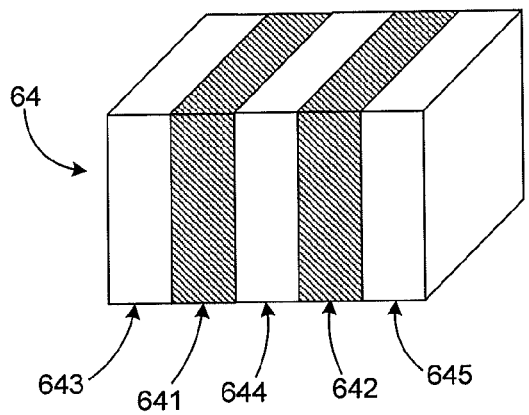
FIG. 8 is another elastomeric connector according with the disclosure.
Figure 9:
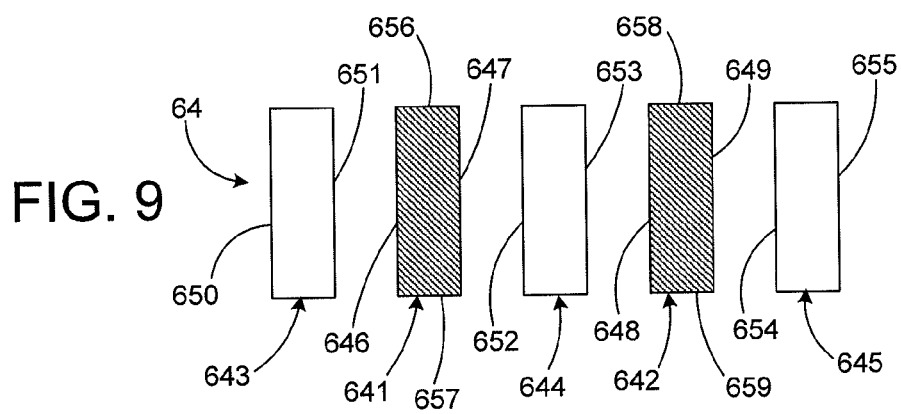
FIG. 9 is a cross-sectional view of the elastomeric connector shown in FIG. 8.

Turning now to FIGS. 8 and 9, another embodiment of the elastomeric connector is indicated by reference numeral 64. The electrical probe 100 having the elastomeric connector 64 is configured to four-wire measure rectangular conductor-style Zebra strip with another electrical probe 100 having the same elastomeric connector 64. Alternatively, the electrical probe 100 having an elastomeric connector 64 is configured to two-wire measure rectangular conductor-style Zebra strip by itself.

The elastomeric connector 34 has two conductive layers 641, 642 and three nonconductive layers 643, 644, and 645. The conductive layer 641 defines two opposing walls 646 and 647. The conductive layer 642 defines two opposing walls 648 and 649. The nonconductive layer 643 defines an outer wall 650 and an inner wall 651. The nonconductive layer 644 defines two opposing walls 652 and 653. The nonconductive layer 645 defines an inner wall 654 and an outer wall 655.

The opposing walls 652 and 653 of the nonconductive layer 644 are respectively in physical contact with the wall 647 of the conductive layer 641 and the wall 648 of the conductive layer 642. The inner wall 651 of the nonconductive layer 643 is in physical contact with the wall 646 of the conductive layer 641. The inner wall 654 of the nonconductive layer 645 is in physical contact with the wall 649 of the conductive layer 642. The outer walls 650 and 655 of the nonconductive layers 643 and 645 are in physical contact with the cavity 22. The conductive layers 641 and 642 also define respectively top surfaces 656 and 658 and bottom surfaces 657 and 659. The top surfaces 656 and 658 are configured to electrically couple to the bottom ends 301 and 302 of the conductive channels 281 and 282, respectively. The bottom surfaces 657 and 659 are configured to enable electrical connection to the electronic device 12. Therefore, two separated electrical connections may be coupled from the electronic device 12 to the data processor 20.

Figure 10:
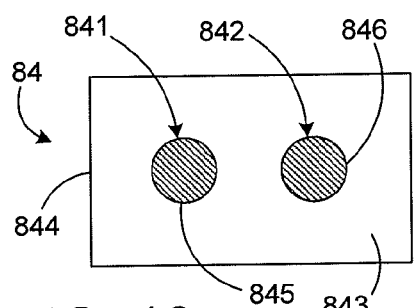
FIG. 10 is a bottom view of another elastomeric connector according with the disclosure.
Figure 11:
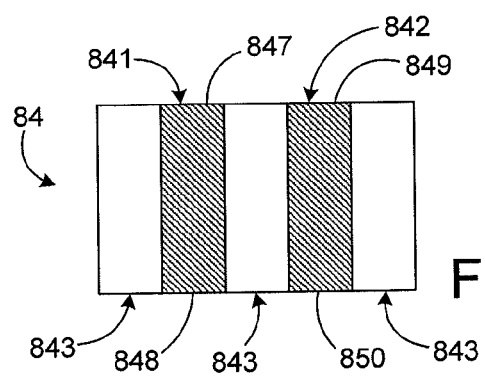
FIG. 11 is a cross-sectional view of the elastomeric connector shown in FIG. 10.

Turning now to FIGS. 10 and 11, another embodiment of the elastomeric connector is indicated by reference numeral 84. The electrical probe 100 having the elastomeric connector 84 is configured to four-wire measure circular conductor-style Zebra strip with another electrical probe 100 having the same elastomeric connector 84. Alternatively, the electrical probe 100 having an elastomeric connector 84 is configured to two-wire measure circular conductor-style Zebra strip by itself. The elastomeric connector 84 comprises a nonconductive layer 843 defining an outer face 844 and two inner faces 845 and 846. The elastomeric connector 84 also comprises two separated conductive pathways 841 and 842 respectively extending among the inner faces 845 and 846. The outer face 844 is in physical contact with the cavity 22. The conductive pathway 841 defines a top surface 847 and a bottom surface 848. The conductive pathway 842 defines a top surface 849 and a bottom surface 850. The top surfaces 847 and 849 are configured to electrically couple to the bottom ends 301 and 302 of the conductive channels 281 and 282, respectively. The bottom surfaces 848 and 850 are configured to enable electrical connection to the electronic device 12. Therefore, two separated electrical connections may be coupled from the electronic device 12 to the data processor 20.

As will be understood by one of ordinary skill in the art, various mechanical configurations similar to FIGS. 10 and 11 can be configured to achieve a similar result.

Figure 12:
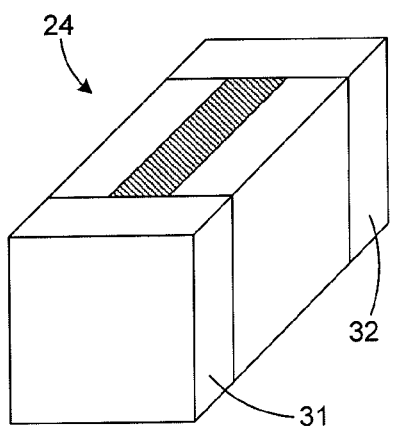
FIG. 12 is another elastomeric connector according with the disclosure.

Turning to FIG. 12, an elastomeric connector 24 is shown as FIG. 3. The elastomeric connector 24 also comprises two protective layers 31 and 32. The protective layer 31 and 32 are in physical contact with the outer walls of the combination of the nonconductive layers and the conductive layers, rather than the top surfaces or the bottom surfaces. A person having ordinary skill in the art may appreciate that the protective layer is preferably applied to the other similar elastomeric connectors 44, 64, and 84, and may be any number of layers in case of the need of a better protection, although there are two protective layers in the illustrated embodiment. The protective layer may be an insulator, a supporter or the combination of both. The protective layer may be made of any suitable material such as silicone rubber material having a porous composition.

A person having ordinary skill in the art may appreciate that the conductive layer may be made of any suitable material such as carbon-filled silicone rubber material. The nonconductive layer may be made of any suitable material such as silicone rubber material. The conductive pathway may be made of any suitable material such as gold-plated phosphor bronze material. The above materials may prevent potential damages when the elastomeric connector is making a contact with objects of the electronic device.

Figure 13:
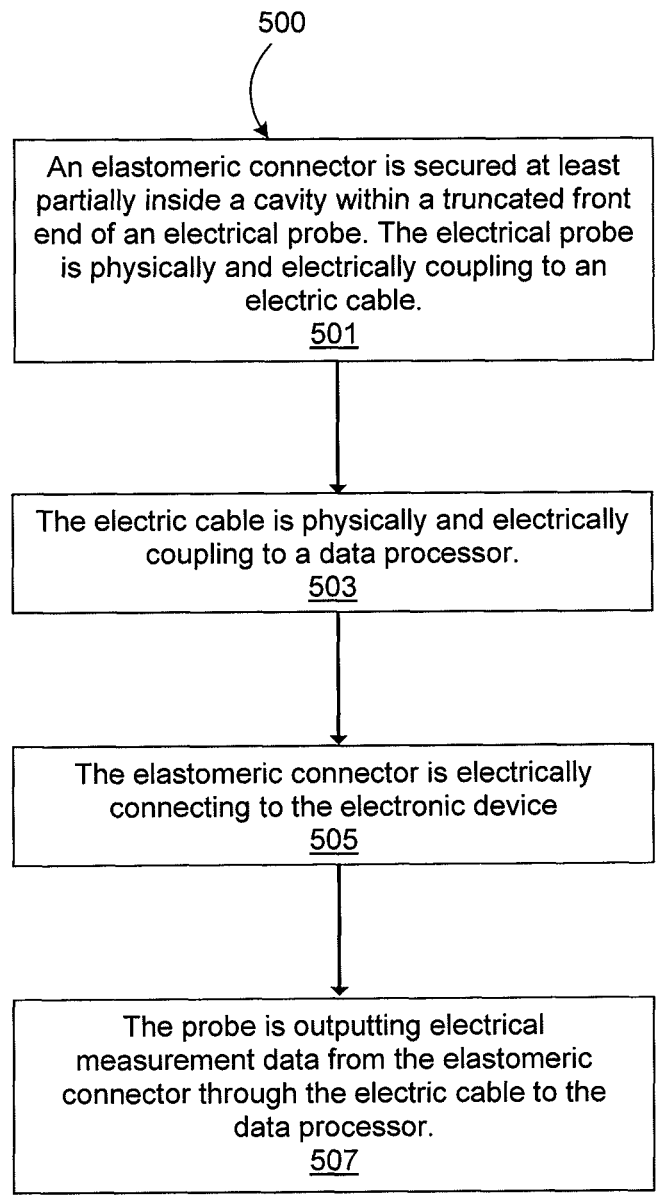
FIG. 13 is an exemplary flowchart of the method according with the disclosure.

FIG. 13 shows a method 500 for acquiring electrical measurements of an electronic device. The method 500 includes, at block 501, an elastomeric connector is secured at least partially inside a cavity within a truncated front end of an electrical probe. The electrical probe is physically and electrically coupling to an electric cable.

At block 503, the electric cable is physically and electrically coupling to a data processor.

At block 505, the elastomeric connector is electrically connecting to the electronic device.

At block 507, the probe is outputting electrical measurement data from the elastomeric connector through the electric cable to the data processor.

Illustrative embodiments of an invention are disclosed herein. One of ordinary skill in the art will readily recognize that the invention may have other applications in other environments. In fact, many embodiments and implementations are possible. The following claims are in no way intended to limit the scope of the present invention to the specific embodiments described above. In addition, any recitation of "means for" is intended to evoke a means-plus-function reading of an element and a claim, whereas, any elements that do not specifically use the recitation "means for", are not intended to be read as means-plus-function elements, even if the claim otherwise includes the word "means". It should also be noted that although the specification lists method steps occurring in a particular order, these steps may be executed in any order, or at the same time.

Although the invention is shown and described with respect to illustrative embodiments, it is evident that equivalents and modifications will occur to those persons skilled in the art upon the reading and understanding hereof. The present invention includes all such equivalents and modifications and is limited only by the scope of the claims if appended hereto.

What is claimed is:

1. A method for acquiring electrical measurements of an electronic device, said method comprising:
    securing an elastomeric connector at least partially inside a cavity within a truncated front end of an electrical probe, wherein the electrical probe is physically and electrically coupled to an electric cable;
    physically and electrically coupling the electric cable to a data processor;
    electrically connecting the elastomeric connector end to said electronic device; and
    outputting electrical measurement data from the elastomeric connector end through the electric cable to said data processor;
    wherein the elastomeric connector comprises at least one protective layer defining two opposing walls, an inner wall of the at least one protective layer being in physical contact with an outer wall of a nonconductive layer and an outer wall of the at least one protective layer being in physical contact with the cavity; and
    wherein the at least one protective layer is comprised of silicone rubber material having a solid composition or a porous composition.

2. The method of claim 1, wherein the elastomeric connector comprises at least one conductive layer defining two opposing walls and at least two nonconductive layers, each nonconductive layer defining two opposing walls, an inner wall of one of the nonconductive layers being in physical contact with one wall of the at least one conductive layer and an inner wall of another nonconductive layer being in physical contact with the other wall of the at least one conductive layer.

3. The method of claim 2, wherein at least one of:
    the at least one conductive layer is comprised of carbon filled silicone rubber material; or
    each nonconductive layer is comprised of silicone rubber material.

4. The method of claim 2, wherein the at least one conductive layer and each nonconductive layer have a height dimension that is equal to at least 1.5 times the width dimension.

5. The method of claim 1, wherein the elastomeric connector comprises at least one nonconductive layer defining two opposing faces, the at least one nonconductive layer comprising at least one conductive pathway extending between the faces.

6. The method of claim 5, wherein at least one of:
    the at least one nonconductive layer is comprised of silicone rubber material; or
    the at least one conductive pathway is comprised of gold-plated phosphor bronze material.

7. The method of claim 1, wherein the at least one protective layer is selected from a group consisting of an insulator and a supporter.

8. The method of claim 1, wherein the data processor is an electronic testing equipment.

9. The method of claim 1, wherein the electronic device comprises an element adapted to enable electrical connection.

10. The method of claim 9, wherein the element is a pin or a wire.

11. The method of claim 1, wherein the truncated front end has at least one tapered side wall.

12. An electrical probe comprising:
    an elongated support adapted to be physically and electrically coupled to an electric cable, wherein the electric cable is physically and electrically coupled to a data processor;
    a truncated front end physically and electrically coupled to the support;
    a cavity within the front end; and
    an elastomeric connector adapted to at least partially fit inside the cavity, the elastomeric connector enabling electrical connection to an electronic device;
    wherein the elastomeric connector comprises at least one protective layer defining two opposing walls, an inner wall of the at least one protective layer being in physical contact with an outer wall of a nonconductive layer and an outer wall of the at least one protective layer being in physical contact with the cavity; and
    wherein the at least one protective layer is comprised of silicone rubber material having a solid composition or a porous composition.

13. The electrical probe of claim 12, wherein the elastomeric connector comprises at least one conductive layer defining two opposing walls and at least two nonconductive layers, each nonconductive layer defining two opposing walls, an inner wall of one of the nonconductive layers being in physical contact with one wall of the at least one conductive layer and an inner wall of another nonconductive layer being in physical contact with the other wall of the at least one conductive layer.

14. The electrical probe of claim 13, wherein at least one of:
   the at least one conductive layer is comprised of carbon-filled silicone rubber material; or
   each nonconductive layer is comprised of silicone rubber material.

15. The electrical probe of claim 13, wherein the at least one conductive layer and each nonconductive layer have a height dimension that is equal to at least 1.5 times the width dimension.

16. The electrical probe of claim 12, wherein the elastomeric connector comprises at least one nonconductive layer defining two opposing faces and at least one conductive pathway extending between the faces.

17. The electrical probe of claim 16, wherein at least one of:
   the at least one nonconductive layer is comprised of silicone rubber material; or
   the at least one conductive pathway is comprised of gold-plated phosphor bronze material.

18. The electric probe of claim 12, wherein the at least one protective layer is selected from a group consisting of an insulator and a supporter.

19. The electric probe of claim 12, wherein the data processor is an electronic testing equipment.

20. The electric probe of claim 12, wherein the electronic device comprises an element adapted to enable electrical connection.

21. The electric probe of claim 20, wherein the element is a pin or a wire.

22. The electric probe of claim 16, wherein the front end has at least one tapered side wall.

\* \* \* \* \*